(12) United States Patent
Chen et al.

(10) Patent No.: US 7,313,161 B2
(45) Date of Patent: Dec. 25, 2007

(54) SPREAD SPECTRUM CLOCK GENERATOR AND METHOD OF GENERATING SPREAD SPECTRUM CLOCK

(75) Inventors: Chia-Ping Chen, Taipei (TW); Chin-Yang Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 665 days.

(21) Appl. No.: 10/939,073

(22) Filed: Sep. 10, 2004

(65) Prior Publication Data
US 2006/0056490 A1    Mar. 16, 2006

(51) Int. Cl.
*H04B 1/00* (2006.01)

(52) U.S. Cl. .................................................. 375/130

(58) Field of Classification Search ........... 375/130, 375/135, 136, 146, 147, 376; 331/1 A, 78
See application file for complete search history.

(56) References Cited

U.S. PATENT DOCUMENTS

| | | |
|---|---|---|
| 5,488,627 A | 1/1996 | Hardin et al. |
| 5,631,920 A | 5/1997 | Hardin |
| 5,867,524 A | 2/1999 | Booth et al. |
| 5,872,807 A | 2/1999 | Booth et al. |
| 2004/0076221 A1* | 4/2004 | Refaeli et al. ............... 375/130 |
| 2004/0085108 A1* | 5/2004 | Murata et al. ............... 327/158 |

OTHER PUBLICATIONS

Spread spectrum definition, Glossary—CNET.com, http://www.cnet.com/Resources/Info/Glossary/Terms/spreadspectrum.html, accessed Jun. 4, 2004.
Spread spectrum definition, Wikipedia, the free encyclopedia http://en.wikipedia.org/wiki/Spread-spectrum, accessed Jun. 4, 2004.

* cited by examiner

*Primary Examiner*—Sam K. Ahn
(74) *Attorney, Agent, or Firm*—Duane Morris LLP

(57) ABSTRACT

A clock circuit for generating a spread spectrum clock signal with reduced amplitude electromagnetic interference (EMI) spectral components is provided where the clock circuit includes a delay line circuit, the delay line circuit providing a spread spectrum clock signal from a reference clock signal in response to a modulation signal, a delay of said delay line circuit being controlled by said modulation signal.

19 Claims, 5 Drawing Sheets

SPREAD SPECTRUM CLOCK GENERATOR AND METHOD OF GENERATING SPREAD SPECTRUM CLOCK

FIELD OF THE INVENTION

The present invention relates to clock circuits having reduced measurable electromagnetic interference (EMI) emissions, and more specifically to spread spectrum clock circuits and methods of generating spread spectrum clock signals.

BACKGROUND OF THE INVENTION

Many electronic devices employ microprocessors or other digital circuits that require one or more clock signals for synchronization and other functions. A clock signal permits precise timing of events in the microprocessor, for example. Typical microprocessors may be supervised or synchronized by a free-running oscillator, such as an oscillator driven by a crystal, an LC-tuned circuit or an external clock source. Clocking rates up to 40 MHz, 66 MHz, 100 MHz, 133 MHz, 200 MHz and beyond are common in personal computers. The parameters of a clock signal are typically specified for a microprocessor and may include minimum and maximum allowable clock frequencies, tolerances on the high and low voltage levels, maximum rise and fall times on the waveform edges, pulse-width tolerance if the waveform is not a square wave and the timing relationship between clock phase if two-clock phase signals are needed.

High performance microprocessor-based devices using leading edge, high-speed circuits are particularly susceptible to generating and radiating electromagnetic interference (EMI). The spectral components of the EMI emissions typically have peak amplitudes at harmonics (i.e., whole number multiples) of the fundamental frequency of the clock circuit. Accordingly, many regulatory agencies, such as the FCC in the United States, have established testing procedures and maximum allowable emissions for such products.

Practical synchronous digital systems radiate electromagnetic energy in a number of narrow bands at the clock frequency and its harmonics, resulting in a frequency spectrum that, at certain frequencies, can exceed regulatory limits for electromagnetic interference. In order to comply with government limits on EMI emissions, costly suppression measures or extensive shielding may be required. Other approaches for reducing EMI include careful routing of signal traces on printed circuit boards to minimize loops and other potentially radiating structures. Unfortunately, such an approach often leads to more expensive multilayer circuit boards with internal ground planes. In addition, greater engineering effort must go into reducing EMI emissions. The difficulties caused by EMI emissions are made worse at higher processor and clock speeds.

An alternative approach is to reduce the spectral density of the EMI by lowering the peak energy emissions at harmonics using a spread spectrum clock signal. This approach consists of modulating the frequency of the clock signal by either a regular function such as a triangular wave or by a pseudo-random function. This method distributes the energy of the clock signal over a wider frequency range, thereby reducing its peak spectral density. This procedure works because the EMI receivers used by testing laboratories divide the electromagnetic spectrum into frequency bands approximately 120 kHz wide. If the system under test were to radiate all of its energy at one frequency, then this energy would fall into a single frequency band of the receiver, which would register a large peak at that frequency. Spread spectrum clocking distributes the energy so that it falls into a large number of the receiver's frequency bands, without putting enough energy into any one band to exceed the statutory limits.

FIG. 1 is a schematic illustration of this effect where the spectral amplitude versus frequency at a harmonic (NF) is indicated by the plot labeled M. As also shown, the spectrum at the harmonic of a standard clock signal is given as an impulse function labeled I. The spectrum of the spread spectrum clock signal at the same harmonic frequency ideally assumes a trapezoidal shape as illustrated by the plot labeled T.

FIG. 2 is a block diagram of a spread spectrum clock generator circuit 10 including a phase locked loop (PLL), such as proposed in U.S. Pat. Nos. 5,488,627, 5,631,920, 5,867,524 and 5,827,807, the entirety of which are hereby incorporated by reference herein. The PLL 10 includes a first frequency divider 12, a phase detector 14, low pass filter 16, voltage controlled oscillator 18 and second frequency divider 20. The circuit 10 frequency modulates an externally generated clock signal designated "Ref", such as a signal generated by a piezoelectric crystal driven at its resonant frequency by a suitable driver or oscillator circuit, to provide a spread spectrum output clock signal CLK. The frequency modulation of the clock signal reduces spectral amplitude of the EMI components at each harmonic of the clock when compared to the spectrum of the same clock signal without modulation.

Although the spread spectrum clock signal circuit 10 can reduce the EMI emissions in an electronic device, the modulation is done through a complex PLL circuit as illustrated. Further, the output clock signal is mostly influenced by the phase noise of the oscillator circuit 18 but not the reference signal Ref. The reference signal passes through the VCO 18 and is fed back through the phase detector 14. If the reference signal is a very high frequency input and the phase noise of the VCO 18 is not proper with respect to the high frequency reference signal, the VCO 18 will influence the precision of the output clock signal.

Therefore, there remains a need for a less complex circuit and method for generating a spread spectrum clock signal. Still further, there remains a need for a circuit and method for generating a spread spectrum clock signal with improved phase noise.

SUMMARY OF THE INVENTION

A clock circuit for generating a spread spectrum clock signal with reduced amplitude electromagnetic interference (EMI) spectral components is provided where the clock circuit includes a delay line circuit, the delay line circuit providing a spread spectrum clock signal from a reference clock signal in response to a modulation signal, a delay of said delay line circuit being controlled by said modulation signal.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
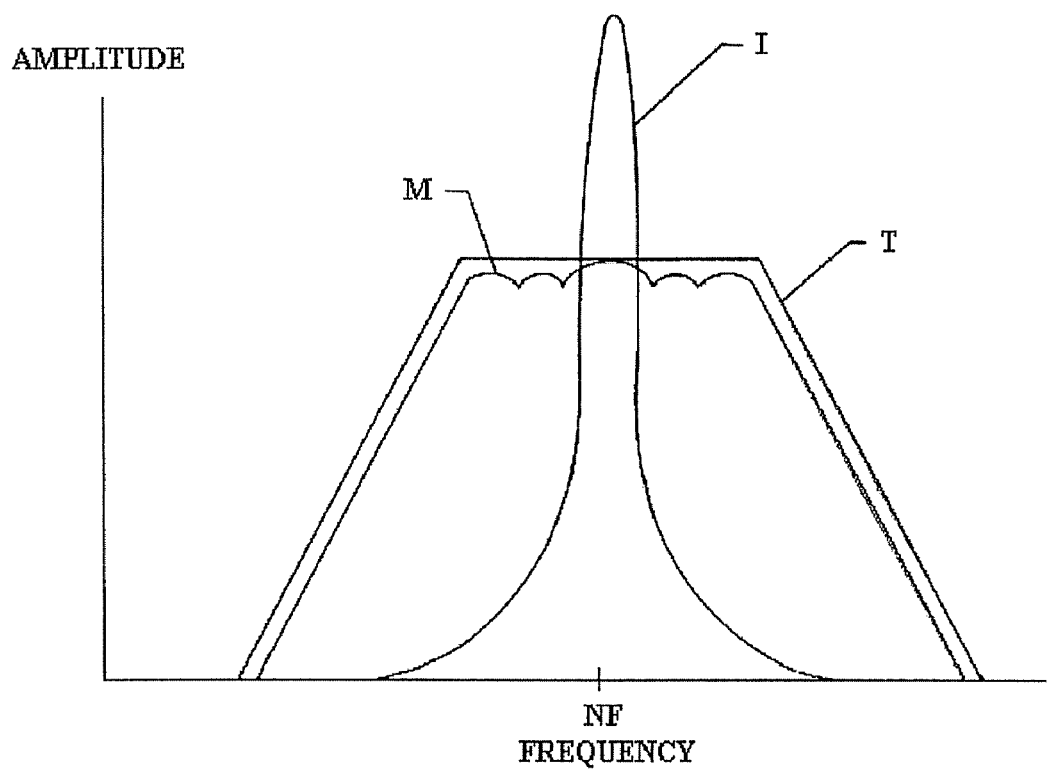
FIG. 1 is a schematic illustration and comparison of the spectral amplitude of a non-spread spectrum clock signal and a spread spectrum clock signal at a harmonic frequency.
Figure 2:
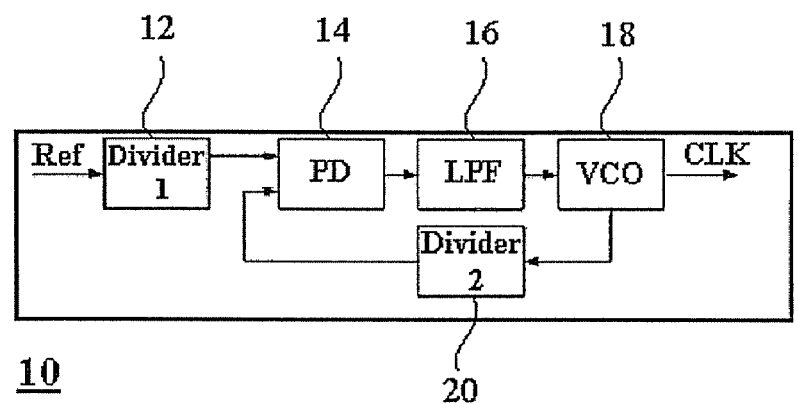
FIG. 2 is a block diagram of a prior art circuit for generating a spread-spectrum clock signal.
Figure 3:
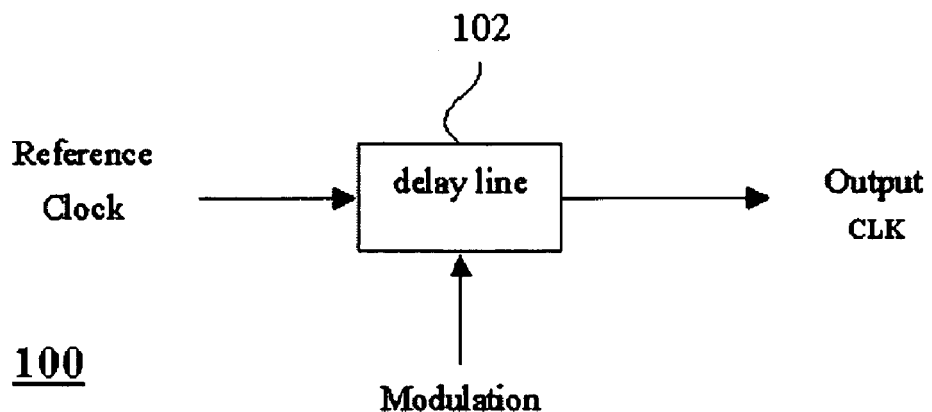
FIG. 3 is a block diagram of a spread spectrum clock signal generator utilizing a delay line.

FIG. 3 is a block diagram of a spread spectrum clock signal generator 100 for reducing the peak spectral content of a clock signal, thereby limiting electromagnetic interference from electronic devices using the clock signal. In one embodiment, the clock signal generator 100 is formed in an integrated circuit included in, for example, a crystal oscillator, a microprocessor of a portable computer or other device. The clock signal generator includes a delay line 102 that provides a spread spectrum clock signal (labeled "Output CLK") from a Reference Clock signal (i.e., a series of clock pulses) and a modulation signal. In preferred embodiments, the delay line 102 is either a voltage controlled delay line or a current controlled delay. The generation of the spread spectrum clock signal is first mathematically described. Then, a specific embodiment 100A (FIG. 4, but not limited to this implementation) of a spread spectrum clock signal generator is described.

A reference clock signal having a frequency $W_o$ is provided to the delay line, which produces an output spread spectrum clock signal having a frequency W. The delay line receives a modulation signal having a frequency $W_m$ and a voltage amplitude $V_c$. For illustrative purposes, assume that the reference clock conforms to the equation $Sin(W_o \cdot t + \theta_o)$ where $\theta_0$ is the phase of the reference clock signal. The amplitude of the modulation signal is defined as follows: $V_c(t) = a \cdot Sin(W_m \cdot t)$ where "a" is a constant number and "t" is time. By using the modulation signal to control the delay time of the delay line, the phase of the output signal, i.e., $\theta(t)$, is equal to $W_o \cdot t + k \cdot V_c$, where k is a constant. The modulation signal controls the delay time of the delay line by its voltage level. The delay time is in inverse proportion to the voltage level. The phase of the output signal is then: $\theta(t) = W_o \cdot t + a \cdot k \cdot Sin(W_m \cdot t)$. Frequency is the derivative of the phase signal, so $W(t) = d\theta/dt = W_o + a \cdot k \cdot W_m \cdot Cos(W_m \cdot t)$, which defines a spread spectrum output clock signal.

Figure 4:
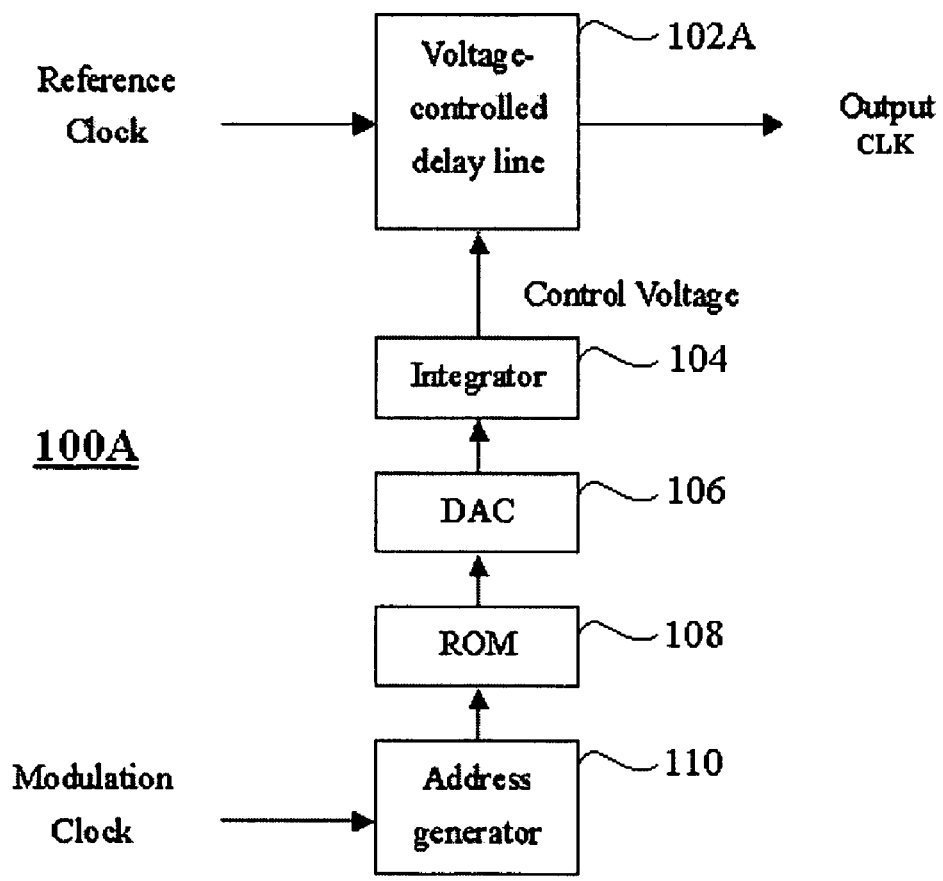
FIG. 4 is a block diagram of an embodiment of a spread spectrum clock signal generator.

Referring to FIG. 4, a preferred embodiment of a spread spectrum clock signal generator 100A is shown, although other embodiments may be utilized. The generator 100A includes a voltage controlled delay line 102A, which provides a spread spectrum clock signal in response to a reference clock signal and a control voltage signal. In one embodiment, the reference clock signal is a square wave at a frequency between about 40-200 MHz The control voltage is generated by blocks 104-110 as described below.

A modulation clock signal is provided to address generator 110 to sample the address generator. In one embodiment, the modulation clock has a frequency of greater than or equal to about 28 kHz, and in one embodiment, between about 28 kHz and 1 MHz. The address generator 110 is a counter that repeats every $2^n$ times. The counter provides a new address value to the ROM 108 under control of the modulation clock (i.e., once per period of the modulation clock). In one embodiment, the address generator includes a lookup table, such as the following table, where n=3:

| 0 | ROM Address 0 |
|---|---|
| 1 | ROM Address 1 |
| 2 | ROM Address 2 |
| 3 | ROM Address 3 |
| 4 | ROM Address 4 |
| 5 | ROM Address 5 |
| 6 | ROM Address 6 |
| 7 | ROM Address 7 |

The first time that the modulation clock triggers the Address Generator 110, i.e., event "0", ROM Address 0 is provided to ROM 108. The eighth time that the modulation clock triggers the Address Generator 110, i.e., event "7", ROM Address 7 is provided to the ROM 108. The sequence then repeats itself, such that the ninth time that the modulation clock triggers the Address Generator 110, ROM Address 0 is again provided to the ROM 108, and so on.

Figure 5:
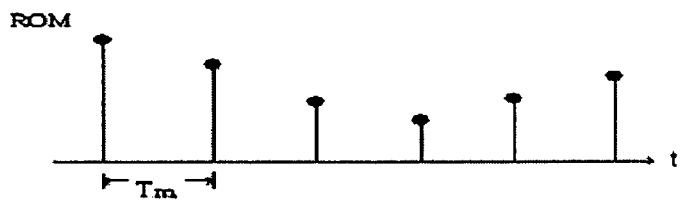
FIG. 5 illustrates sample data retrieved from the memory of the generator of FIG. 4.

ROM 108 has stored therein counting values pointed to by specific address values generated by Address Generator 110. The sampling rate depends on the period $T_m$ of the modulation clock. An example of values retrieved from ROM 108 is illustrated in FIG. 5. Every modulation clock period Tm, which is significantly longer than the reference clock period, a new value is retrieved from ROM 108. Although the modulation generation means is shown as including a ROM 108, other memory structure may also be used.

The data (i.e., counting values) in ROM 108 can be selected based on the desired modulation profile. Assuming a sinusoidal modulation profile and a counter cycle of 8 (i.e., n=8), the ROM content corresponds to $[A \cdot Sin(t0), A \cdot Sin(t1) \ldots A \cdot Sin(t7)]$, where $t0 = 0/4*pi$, $t1 = 1/4*pi$, ... $t7 = 7/4*pi$ and A is a constant amplitude. For a triangular modulation profile, the ROM content corresponds to [0, A/2, A, A/2, 0, −A/2. −A, −A/2], where A is again constant and n=8. For a third order waveform modulation profile, the ROM content follows the following equation: $0.45 \cdot t^3 + 0.55 \cdot t$ in quarter cycles, also known as the optimized (Lexmark or Hershey Kiss) modulation, i.e., [−1, −0.33125, 0, 0.33125, 1, 0.33125, 0, −0.33125] for n=8.

Figure 6:
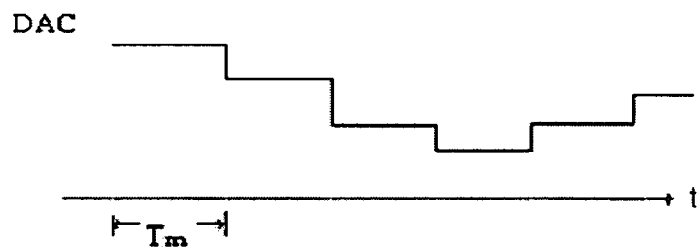
FIG. 6 illustrates an analog signal generated from the data of FIG. 5 with the DAC of FIG. 4.
Figure 7:
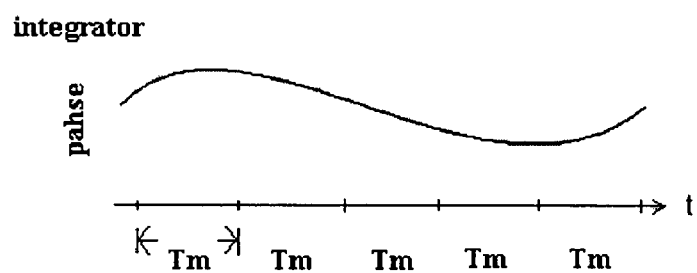
FIG. 7 illustrates a modulation signal provided by the integrator of FIG. 4 from the signal of FIG. 6.

The digital to analog converter (DAC) 106 converts the sampled data from the ROM 108 into an analog signal, such as the stepped analog signal shown in FIG. 6. The integrator 104 then integrates the analog signal provided by the DAC 106 to provide a phase signal as shown in, for example, FIG. 7, that changes phase with time. This phase signal, which has a complete period of $8*T_m$, is the modulation signal that controls the voltage controlled delay line 102A as described above. The signal exhibits a change in phase over time, as the phase $\theta$ is equal to $W_m \cdot t + \theta_o$. The product $W_m \cdot t$ varies with time period, resulting in a time dependent phase $\theta$ as shown in FIG. 7.

FIG. 4 illustrates a mixed analog and digital means of generating the modulation signal for controlling the delay of the delay line. It should be apparent, however, that the modulation signal can be generated by pure analog techniques. One advantage to the mixed digital/analog embodiment of FIG. 4 is that the data in ROM 108 can be reprogrammed, thereby providing added control over the delay of the delay line 102A and generation of the spread spectrum clock signal.

Figure 8:
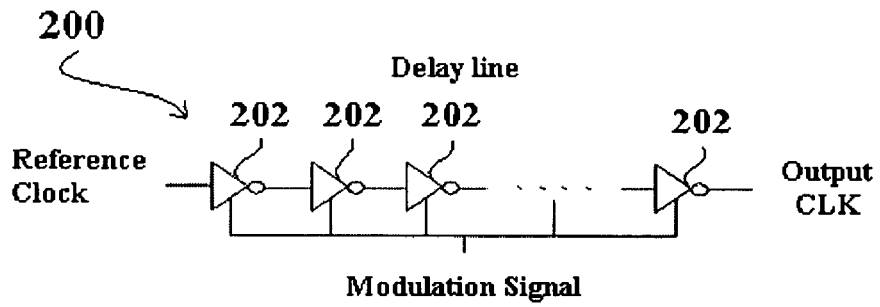
FIG. 8 illustrates an embodiment of the delay line of FIG. 4.

FIG. 8 illustrates an exemplary embodiment of a delay line 200. In this embodiment, the delay line 200 includes a plurality of series coupled inverters 202. The series of inverters receives the reference clock signal and each inverter 202 is coupled with the modulation signal. The series of inverters, with the total delay controlled by the modulation signal, provides an output signal corresponding to the spread spectrum clock signal.

Figure 8A:
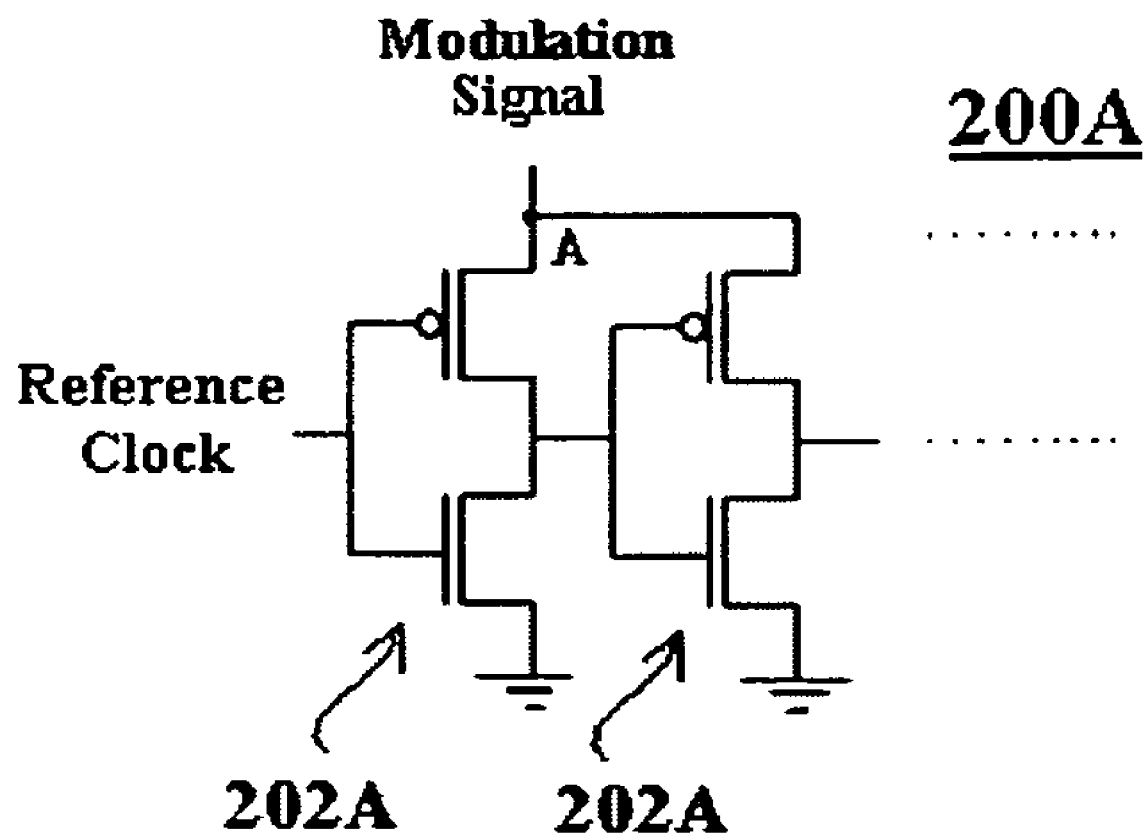
FIG. 8A is a more detailed illustration of the delay line of FIG. 8.

FIG. 8A provides a more detailed illustration of the delay line circuit of FIG. 8A. Delay line 200A comprises a plurality of inverters 202A coupled in series. The series of inverters receives the reference clock, and each inverter 202A comprises a pair of transistors coupled between a ground node and a node A, which receives the modulation signal. The voltage at node A, i.e., $V_A(t)$, controls the delay time of the delay line. The delay time is directly proportional to $(1/V_A(t))$. The delay time constantly changes over the phase, $W_m \cdot t$.

Figure 4A:
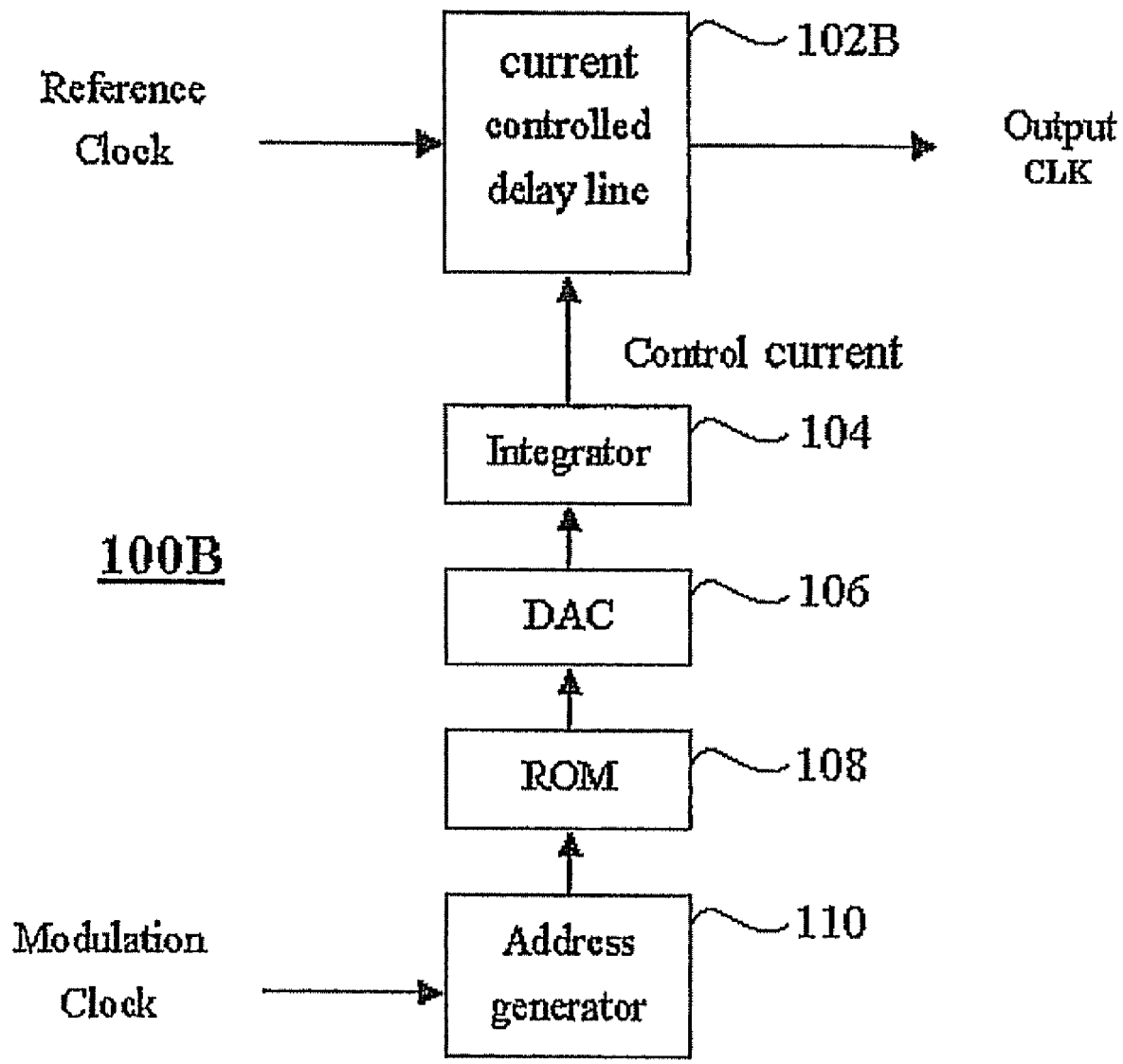
FIG. 4A is a block diagram of another embodiment of a spread spectrum clock signal generator.

The delay line can comprise a voltage controlled delay line or a current controlled delay line, depending on what kind of signal is used to control the delay time of the delay line. The modulation signal may be a periodical current signal if the delay line is a current controlled delay line. The modulation signal may be a periodical voltage signal if the delay line is a voltage controlled delay line. Alternatively, a voltage-current or current-voltage converter can be used if the modulation signal is a voltage signal and the delay line is current controlled, or vice versa. FIG. 4A illustrates an embodiment of a spread spectrum clock signal generator 100B for a current controlled delay line 102B.

The spread spectrum clock signal generator described herein provides a spread spectrum clock signal without the need for a feedback signal. This approach to generating a spread spectrum clock signal does not suffer from the phase noise degradation problems attributed to the use of a voltage controlled oscillator with high frequency signals of prior art phase lock loop techniques. The approach described herein provides a low phase noise clock output with spread spectrum capability with simplified structure for generating the spread spectrum clock signal, with associated reductions in cost. The circuit can be used to provide a spread spectrum signal from a variety of clock signal sources, such as crystal oscillators, SAW oscillators, or other sources.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A clock circuit for generating a spread spectrum clock signal with reduced amplitude electromagnetic interference (EMI) spectral components, said clock circuit comprising:
   a delay line circuit, said delay line circuit providing a spread spectrum clock signal from a reference clock signal in response to a modulation signal, a delay of said delay line circuit being controlled by said modulation signal; and
   means for generating said modulation signal comprising:
      an address generator responsive to a modulation clock signal;
      a memory for providing data responsive to said address generator;
      a digital to analog converter for providing an analog signal corresponding to data provided from said memory; and
      an integrator for providing said modulation signal from said analog signal.

2. The clock circuit of claim 1, wherein said delay line circuit comprises a plurality of inverters coupled in series, with each of said inverters coupled to receive said modulation signal.

3. The clock circuit of claim 1, wherein said delay line is a voltage controlled delay line and said modulation signal is a periodic voltage signal.

4. The clock circuit of claim 1, wherein said delay line is a current controlled delay line and said modulation signal is a periodic current signal.

5. The clock circuit of claim 1, wherein said modulation signal comprises a time dependent phase signal that changes phase with time.

6. The clock circuit of claim 1, wherein said modulation clock signal has a frequency lower than a frequency of said reference clock signal.

7. The clock circuit of claim 6, wherein said modulation clock signal frequency is greater than or equal to about 28 kHz and said reference clock signal frequency is between about 40-200 MHz.

8. A method of generating a spread spectrum clock signal with reduced amplitude electromagnetic interference (EMI) spectral components, comprising the steps of:
   generating a series of reference clock pulses;
   providing said series of reference clock pulses to a delay line circuit, a delay of said delay line circuit being controlled by a modulation signal to provide a spread spectrum clock signal from said series of clock pulses, wherein said modulation signal comprises a time dependent phase signal that changes phase over time; and
   generating said phase signal, said generating step comprising the steps of:
      providing data from a memory under control of a modulation clock signal;
      converting said data to an analog signal; and
      integrating said analog signal to provide said phase signal.

9. The method of claim 8 wherein said delay line circuit comprises a plurality of inverters coupled in series, with each of said inverters coupled to receive said modulation signal.

10. The method of claim 8 wherein a frequency of said modulation clock signal is less than a frequency of said series of reference clock pulses.

11. The method of 10 wherein said modulation clock signal frequency is greater than or equal to about 28 kHz and said reference clock pulses frequency is between about 40-200 MHz.

12. An electronic device having reduced amplitude electromagnetic interference (EMI) spectrum components comprising:
   a clock circuit for generating a spread spectrum clock signal, said clock circuit comprising: a delay line circuit, said delay line circuit providing a spread spectrum clock signal from a reference clock signal in response to a modulation signal, a delay of said delay line circuit being controlled by said modulation signal; and
   means for generating said modulation signal, wherein said generating means comprises:
      an address generator responsive to a modulation clock signal;
      a memory for providing data responsive to said address generator;
      a digital to analog converter for providing an analog signal corresponding to data provided from said memory; and an integrator for providing said modulation signal from said analog signal.

13. The device of claim 12, wherein said delay line circuit comprises a plurality of inverters coupled in series, with each of said inverters coupled to receive said modulation signal.

14. The device of claim 12, wherein said delay line is a voltage controlled delay line and said modulation signal is a periodic voltage signal.

15. The device of claim 12, wherein said delay line is a current controlled delay line and said modulation signal is a periodic current signal.

16. The device of claim 12, wherein said modulation signal comprises a time dependent phase signal that changes phase with time.

17. The device of claim 12, wherein said modulation clock signal has a frequency lower than a frequency of said reference clock signal.

18. The device of claim 17, wherein said clock signal frequency is greater than or equal to about 28 kHz and said reference clock signal frequency is between about 40-200 MHz.

19. An electronic device having reduced amplitude electromagnetic interference (EMI) spectrum components comprising:

a clock circuit for generating a spread spectrum clock signal with reduced amplitude electromagnetic interference (EMI) spectral components, said clock circuit comprising:
a delay line circuit comprising a plurality of inverters coupled in series, each inverter coupled between a first node and a modulation signal node, said delay line circuit providing a spread spectrum clock signal from a reference clock signal in response to a modulation signal at said modulation node comprising a time dependent phase signal that changes phase with time, wherein a frequency of said reference clock signal is greater than a frequency of said modulation signal, a delay of said delay line circuit being controlled by said modulation signal;
an address generator responsive to a modulation clock signal;
a memory for providing data responsive to said address generator;
a digital to analog converter for providing an analog signal corresponding to data provided from said memory; and
an integrator for providing said modulation signal from said analog signal.

* * * * *